(12) United States Patent
Jung (10) Patent No.: US 9,355,707 B2
(45) Date of Patent: May 31, 2016

(54) GAPLESS PATTERN DETECTION CIRCUIT AND SEMICONDUCTOR DEVICE INCLUDING THE SAME

(71) Applicant: SK hynix Inc., Gyeonggi-do (KR)

(72) Inventor: Ho-Don Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/455,624

(22) Filed: Aug. 8, 2014

(65) Prior Publication Data

US 2015/0262651 A1 Sep. 17, 2015

(30) Foreign Application Priority Data

Mar. 17, 2014 (KR) .......................... 10-2014-0031031

(51) Int. Cl.
| | | |
|---|---|---|
| G11C 7/00 | (2006.01) |
| G11C 11/4091 | (2006.01) |
| G11C 11/4093 | (2006.01) |
| G11C 7/08 | (2006.01) |
| G11C 7/10 | (2006.01) |
| G11C 11/4076 | (2006.01) |

(52) U.S. Cl.
CPC .............. *G11C 11/4091* (2013.01); *G11C 7/08* (2013.01); *G11C 7/109* (2013.01); *G11C 7/1045* (2013.01); *G11C 11/4093* (2013.01); *G11C 11/4076* (2013.01)

(58) Field of Classification Search
USPC .................................. 365/191, 193, 205, 227
See application file for complete search history.

(56) References Cited

U.S. PATENT DOCUMENTS

| | | | | |
|---|---|---|---|---|
| 6,104,656 A | * | 8/2000 | Jung .............................. 365/207 |
| 7,158,430 B2 | * | 1/2007 | Byun ............................. 365/205 |
| 2006/0245284 A1 | * | 11/2006 | Do ................................. 365/207 |
| 2007/0076500 A1 | * | 4/2007 | Im et al. ........................ 365/208 |
| 2008/0079472 A1 | * | 4/2008 | Kang ............................ 327/172 |

FOREIGN PATENT DOCUMENTS

KR 1020120097990 9/2012

* cited by examiner

*Primary Examiner* — Hoai V Ho
(74) *Attorney, Agent, or Firm* — IP & T Group LLP (57) ABSTRACT

A semiconductor device that includes: a detection circuit suitable for detecting a gapless pattern section of a detection target signal; and an internal circuit suitable for performing a normal operation during a normal section and additionally performing the normal operation during a compensating section corresponding to the gapless pattern section in response to a detection result signal outputted from the detection circuit.

20 Claims, 8 Drawing Sheets

GAPLESS PATTERN DETECTION CIRCUIT AND SEMICONDUCTOR DEVICE INCLUDING THE SAME

CROSS-REFERENCE TO RELATED APPLICATIONS

The present application claims priority of Korean Patent Application No. 10-2014-0031031, filed on Mar. 17, 2014, which is incorporated herein by reference in its entirety.

BACKGROUND

1. Field

Various embodiments of the present invention relate to a semiconductor design technology and, more particularly, to a gapless pattern detection circuit and a semiconductor device including the same.

2. Description of the Related Art

Operating speeds of semiconductor devices are increasing to satisfy user demand. As semiconductor devices operate faster, current consumption increases and signal transmission problems may occur. This may be a result of not being able to perform a full swing during signal transfer. The net result is that the performance of the semiconductor device is degraded.

For example, when a read command with a gapless pattern (a pattern in which a signal, e.g., read command, sequentially toggles without a time-gap) is inputted in a high frequency environment, such as in dynamic random access memory (DRAM), there may be a concern in that the bit line voltage drops due to successive read operations.

SUMMARY

Various embodiments of the present invention are directed to a semiconductor device that may detect a gapless pattern section of a signal for directing a predetermined operation.

In accordance with an embodiment of the present invention, a semiconductor device may include a detection circuit suitable for detecting a gapless pattern section of a detection target signal, and an internal circuit suitable for performing a normal operation during a normal section and additionally performing the normal operation during a compensating section corresponding to the gapless pattern section in response to a detection result signal outputted from the detection circuit.

In accordance with an embodiment of the present invention, a semiconductor device may include a detection circuit suitable for detecting a gapless pattern section of a detection target signal, and an internal circuit suitable for performing a first normal operation during a first normal section and performing a second normal operation, which is a subsequent operation to the first normal operation, during a second normal section and additionally performing the first normal operation during a compensating section corresponding to the gapless pattern section in response to a detection result signal outputted from the detection circuit.

In accordance with an embodiment of the present invention, a gapless pattern detection circuit may include a toggling number detection block suitable for receiving a detection target signal, and generating a section detection signal activated during a gapless pattern section and a number detection signal corresponding to the toggling number of the detection target signal when the detection target signal successively toggles, and a detection result signal generation block suitable for generating a detection result signal, which is activated during a compensating section corresponding to the gapless pattern section, in response to the number detection signal and the section detection signal.

DETAILED DESCRIPTION

Hereafter, exemplary embodiments of the present invention are described below in more detail with reference to the accompanying drawings. These embodiments are provided so that this disclosure will be thorough and complete and will fully convey the scope of the present invention to those skilled in the art. Throughout the disclosure, like reference numerals refer to like parts in the various figures and embodiments of the present invention.

Throughout the specification, when an element is referred to as being "coupled" to another element, the element may be "directly coupled" to the other element and/or "electrically coupled" to the other element with additional elements interposed therebetween. Furthermore, when and embodiment "comprises" (or "includes" or "has") some elements, it should be understood that it may include (or include or has) only those elements, or it may include (or include or have) additional elements unless expressly stated otherewise. The singular form may include the plural form, and vice versa, unless expressly stated otherwise.

Figure 1:
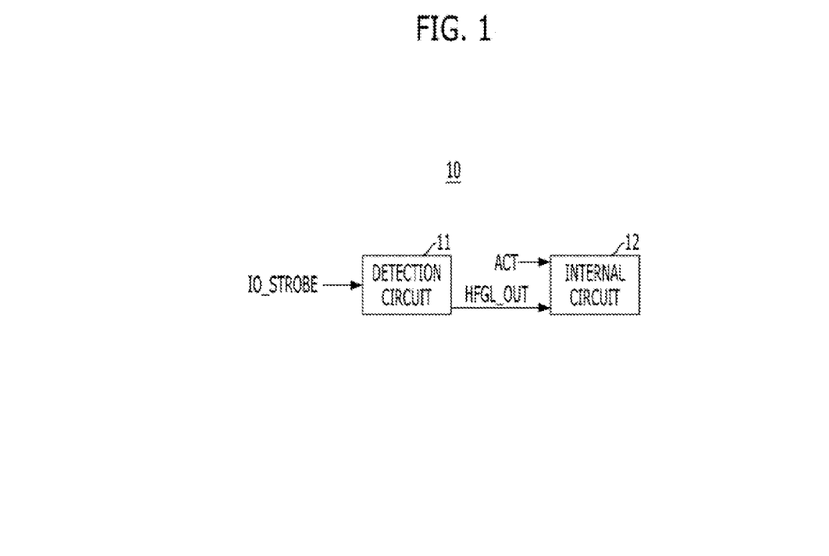
FIG. 1 is a block diagram illustrating a semiconductor device in accordance with an embodiment of the present invention.

FIG. 1 is a block diagram of a semiconductor device 10 in accordance with an embodiment of the present invention.

Referring to FIG. 1, the semiconductor device 10 may include a detection circuit 11 and an internal circuit 12. The detection circuit 11 detects a gapless pattern section of a detection target signal IO_STROBE. The internal circuit 12 performs a predetermined operation in response to a control signal ACT and a detection result signal HFGL_OUT outputted from the detection circuit 11. The gapless pattern section may include a section where the detection target signal IO_STROBE successively toggles.

The detection circuit 11 may activate the detection result signal HFGL_OUT during a compensating section, which is determined based on the toggling number of the detection target signal IO_STROBE, when the detection target signal IO_STROBE sequentially toggles a predetermined number of times or more.

The internal circuit 12 may perform a normal operation during a normal section in response to the control signal ACT and additionally perform the normal operation during the compensating section corresponding to the gapless pattern section in response to the detection result signal HFGL_OUT.

Figure 2:
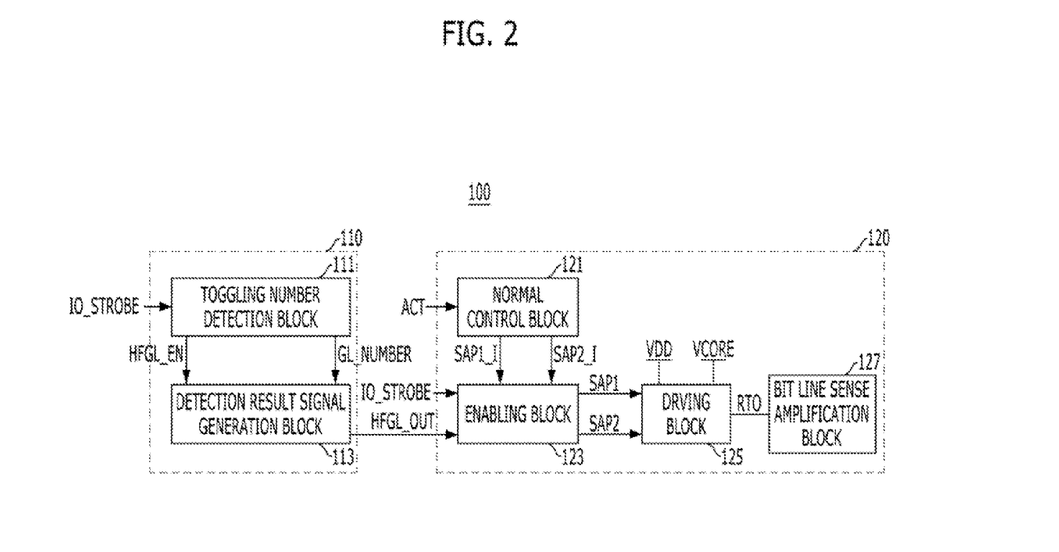
FIG. 2 is a block diagram illustrating a semiconductor device in accordance with an embodiment of the present invention.

FIG. 2 is a block diagram illustrating a semiconductor device 100 in accordance with an embodiment of the present invention.

Referring to FIG. 2, the semiconductor device 100 may include a detection circuit 110 and an internal circuit 120.

The detection circuit 110 may include a toggling number detection block 111 and a detection result signal generation block 113. The toggling number detection block 111 generates a section detection signal HFGL_EN, which is activated during the gapless pattern section, and a number detection signal GL_NUMBER corresponding to the toggling number of a detection target signal IO_STROBE, when the detection target signal IO_STROBE successively toggles. The detection result signal generation block 113 generates the detection result signal HFGL_OUT, which is activated during a compensating section, in response to the number detection signal GL_NUMBER.

The detection target signal IO_STROBE may include a read command or a write command. Hereafter, the detection target signal IO_STROBE is referred to as a read command IO_STROBE.

Figure 3:
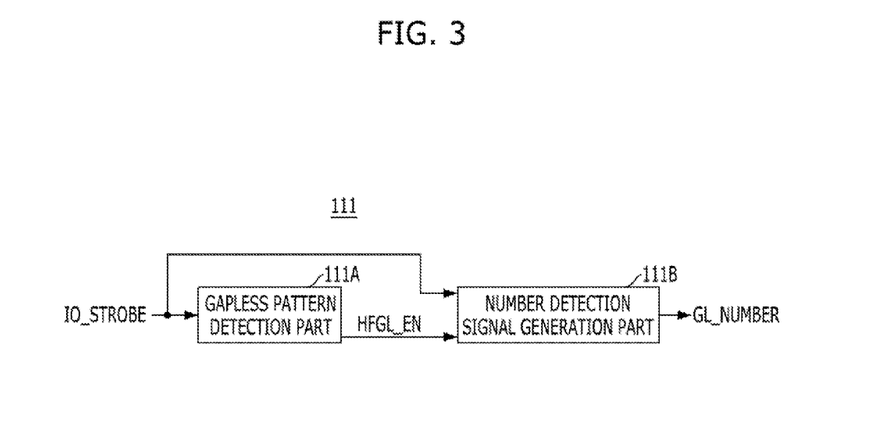
FIG. 3 is a detailed diagram of a toggling number detection block shown in FIG. 2.

FIG. 3 is a detailed diagram of the toggling number detection block 111 shown in FIG. 2.

Referring to FIG. 3, the toggling number detection block 111 may include a gapless pattern detection part 111A and a number detection signal generation part 111B. The gapless pattern detection part 111A generates the section detection signal HFGL_EN in response to the read command IO_STROBE. The number detection signal generation part 111B activates the number detection signal GL_NUMBER when the read command IO_STROBE toggles the predetermined number of times or more in response to the read command IO_STROBE and the section detection signal HFGL_EN.

The gapless pattern detection part 111A detects whether the semiconductor device 100 operates at high speed based on the toggling period of the read command IO_STROBE, and determines whether the section detection signal HFGL_EN is activated based on the detection result. For example, the gapless pattern detection part 111A detects that the semiconductor device 100 operates at high speed when the toggling period of the read command IO_STROBE corresponds to a high frequency, and activates the section detection signal HFGL_EN during the gapless pattern section based on the detection result. On the other hand, the gapless pattern detection part 111A detects that the semiconductor device 100 operates at low speed when the toggling period of the read command IO_STROBE corresponds to a low frequency, and toggles the section detection signal HFGL_EN during the gapless pattern section based on the detection result.

Figure 4A:
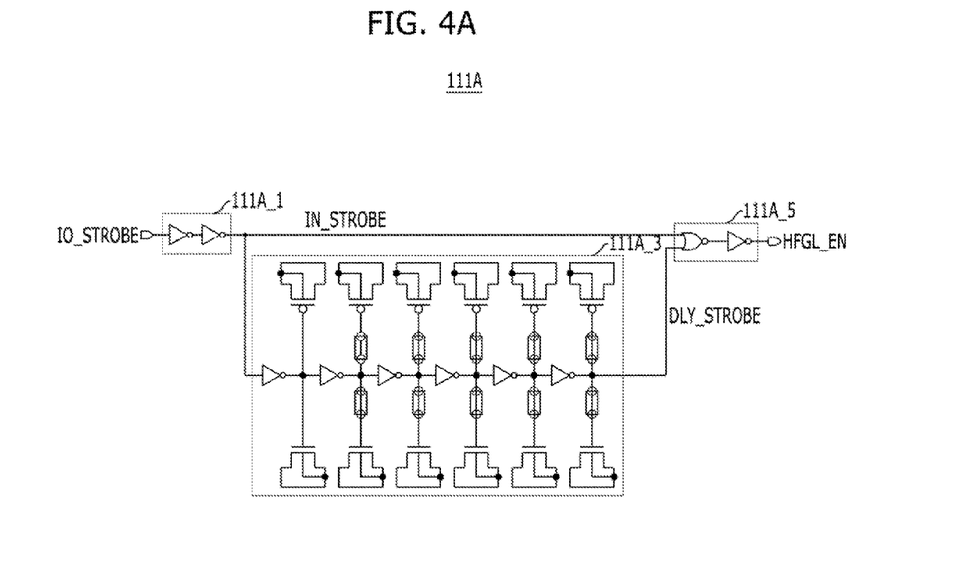
FIG. 4A is a detailed diagram of a gapless pattern detection part shown in FIG. 3.
Figure 4B:
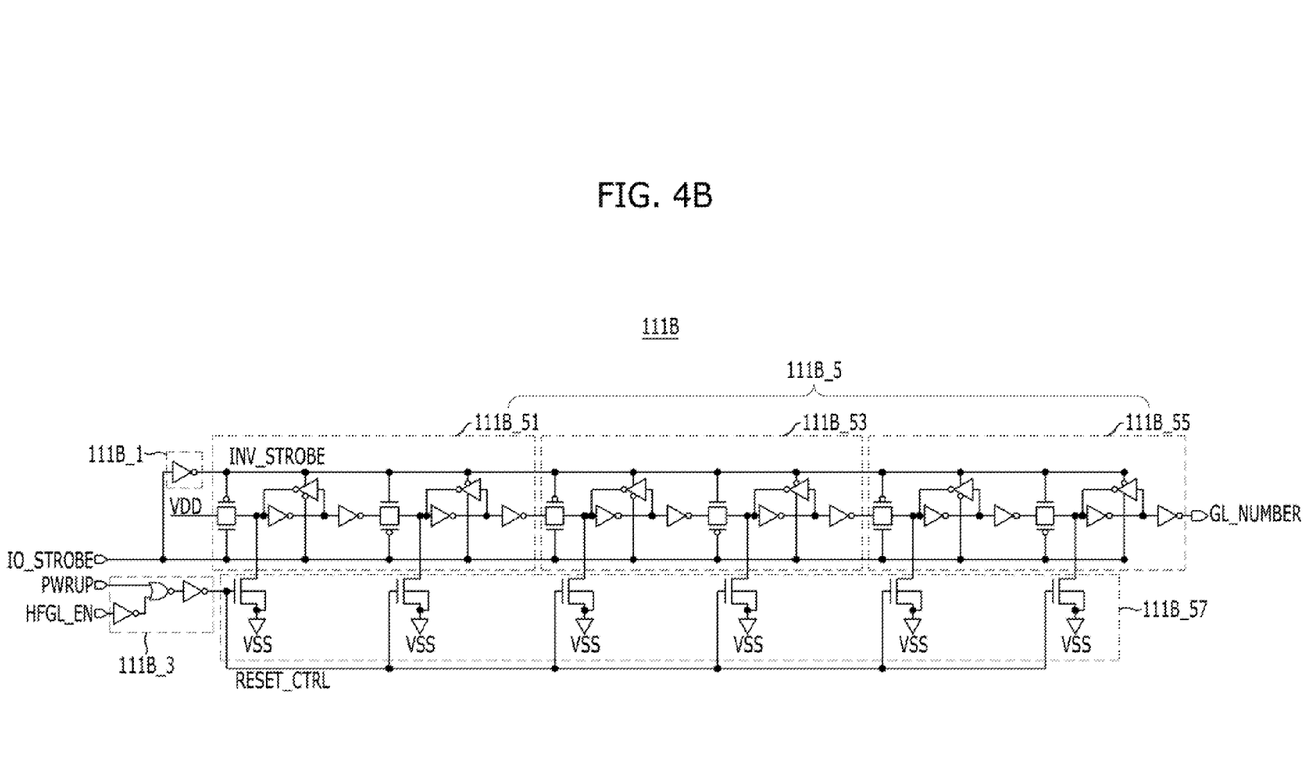
FIG. 4B is a detailed diagram of a number detection signal generation part shown in FIG. 3.

FIG. 4A is a detailed diagram of the gapless pattern detection part 111A shown in FIG. 3. FIG. 4B is a detailed diagram of the number detection signal generation part 111B shown in FIG. 3.

The gapless pattern detection part 111A may include an input unit 111A_1, a delay unit 111A_3 and an output unit 111A_5. The input unit 111A_1 receives the read command IO_STROBE. The delay unit 111A_3 delays an input read command IN_STROBE inputted from the input unit 111A_1 for a predetermined delay time. The output unit 111A_5 generates the section detection signal HFGL_EN in response to the input read command IN_STROBE and a delayed read command DLY_STROBE delayed through the delay unit 111A_3.

The input unit 111A_1 may include two inverters which are coupled with each other in series.

The delay unit 111A_3 may include an RC delay circuit. Since the RC delay circuit is widely known to those skilled in the art, a detailed description thereon is omitted.

The output unit 111A_5 may include a NOR gate for performing a NOR operation on the input read command IN_STROBE and the delayed read command DLY_STROBE and an inverter for inverting an output signal of the NOR gate and outputting the section detection signal HFGL_EN.

Referring to FIG. 4B, the number detection signal generation part 111B may include an inversion unit 111B_1, a reset control unit 111B_3 and a counting unit 111B_5. The inversion unit 111B_1 generates an inverted read command INV_STROBE by inverting the read command IO_STROBE. The reset control unit 111B_3 generates a reset signal RESET_CTRL in response to a power-up signal PWRUP and the section detection signal HFGL_EN. The counting unit 111B_5 counts the toggling number of the read command IO_STROBE and generates the number detection signal GL_NUMBER corresponding to the counting result when the reset signal RESET_CTRL is deactivated.

The inversion unit 111B_1 may include one inverter which receives the read command IO_STROBE and outputs the inverted read command INV_STROBE.

The reset control unit 111B_3 may include an inverter for inverting the section detection signal HFGL_EN, a NOR gate for performing a NOR operation on an output signal of the inverter and the power-up signal PWRUP, and an inverter for inverting an output signal of the NOR gate and outputting the reset signal RESET_CTRL. The reset control unit 111B_3 toggles the reset signal RESET_CTRL corresponding to the section detection signal HFGL_EN when the semiconductor device 100 operates at low speed.

The counting unit 111B_5 may include three D flip-flops 111B_51, 111B_53 and 111B_55 and a reset unit 111B_57. The three D flip-flops 111B_51, 111B_53 and 111B_55 generate the number detection signal GL_NUMBER by sequentially shifting a logic high signal corresponding to a power source voltage VDD as much as the toggling number of the read command IO_STROBE in response to the read command IO_STROBE and the inverted read command INV_STROBE. The reset unit 111B_57 resets input nodes and output nodes of the D flip-flops 111B_51, 111B_53 and 111B_55 to a predetermined logic level in response to the reset signal RESET_CTRL. In the embodiment of the present invention, it is assumed that the three D flip-flops 111B_51, 111B_53 and 111B_55 form the counting unit 111B_5 under conditions in which the read command IO_STROBE toggles three or more times. However, this embodiment is only an example, not a limitation, and the number of the D flip-flops may be different. Meanwhile, the output unit 111A_5 continuously deactivates the number detection signal GL_NUMBER in response to the reset signal RESET_CTRL which toggles when the semiconductor device 100 operates at low speed.

Figure 5:
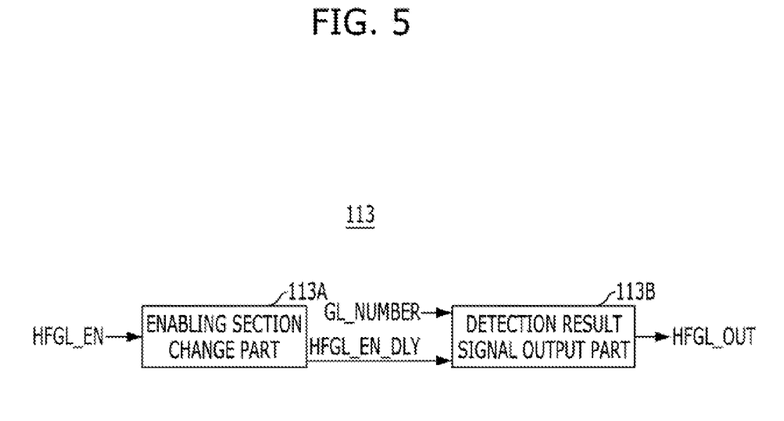
FIG. 5 is a detailed diagram of a detection result signal generation block shown in FIG. 2.

FIG. 5 is a detailed diagram of the detection result signal generation block 113 shown in FIG. 2.

Referring to FIG. 5, the detection result signal generation block 113 may include an enabling section change part 113A and a detection result signal output part 113B. The enabling section change part 113A generates a section change signal HFGL_EN_DLY by changing an enabling section of the section detection signal HFGL_EN. The detection result signal output part 113B activates the detection result signal HFGL_OUT in response to the number detection signal GL_NUMBER and deactivates the detection result signal HFGL_OUT in response to the section change signal HFGL_EN_DLY.

Figure 6A:
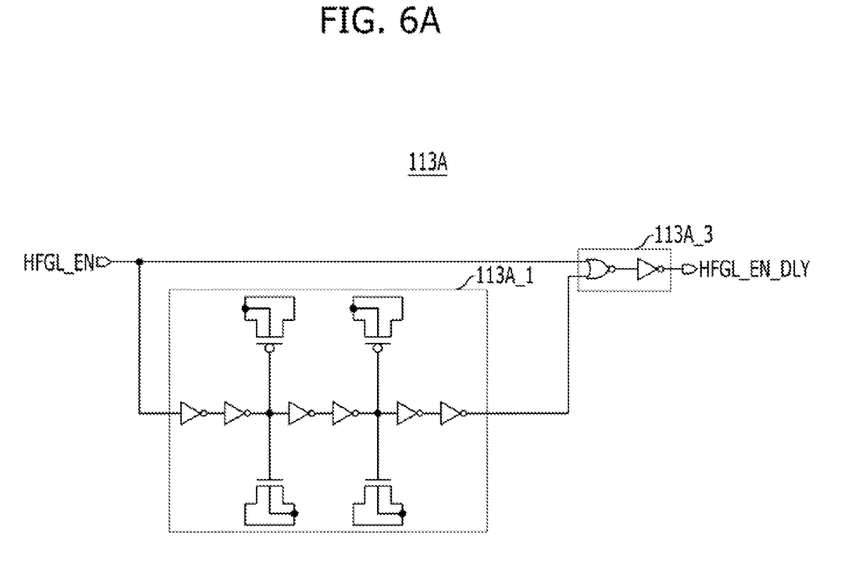
FIG. 6A is a detailed diagram of a section change part shown in FIG. 5.
Figure 6B:
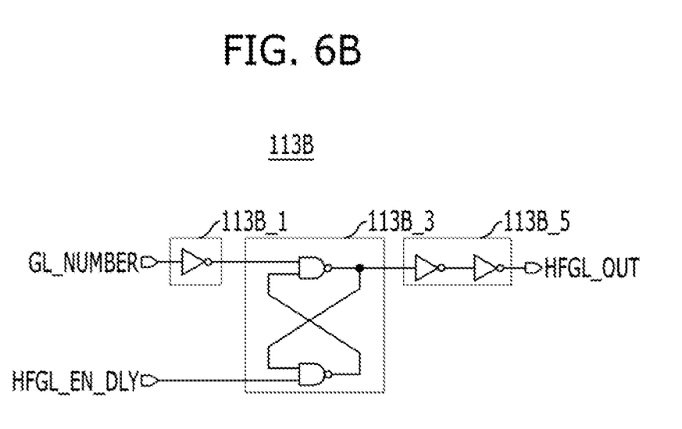
FIG. 6B is a detailed diagram of a detection result signal output part shown in FIG. 5.

FIG. 6A is a detailed diagram of the enabling section change part 113A shown in FIG. 5. FIG. 66 is a detailed diagram of the detection result signal output part 113B shown in FIG. 5.

Referring to FIG. 6A, the enabling section change part 113A may include a delay unit 113A_1 and an output unit 113A_3. The delay unit 113A_1 delays the section detection signal HFGL_EN as long as a predetermined delay time. The output unit 113A_3 outputs the section change signal HFGL_EN_DLY in response to the section detection signal HFGL_EN and a delay section detection signal HFGL_DLY, which is delayed by the delay unit 113A_1.

The delay unit 113A_1 may include an RC delay circuit. Since the RC delay circuit is widely known to those skilled in the art, a detailed description thereon is omitted.

The output unit 113A_3 may include a NOR gate for performing a NOR operation on the section detection signal HFGL_EN and the delay section detection signal HFGL_DLY and an inverter for inverting an output signal of the NOR gate and outputting the section change signal HFGL_EN_DLY.

Referring to FIG. 6B, the detection result signal output part 113B may include an inversion unit 113B_1, an RS latch unit 113B_3 and an output unit 113B_5. The inversion unit 113B_1 inverts the number detection signal GL_NUMBER. The RS latch unit 113B_3 receives an output signal of the inversion unit 113B_1 and the section change signal HFGL_EN_DLY. The output unit 113B_5 outputs an output signal of the RS latch unit 113B_3 as the detection result signal HFGL_OUT.

Referring back to FIG. 2, the internal circuit 120 may perform an over-driving operation during an over-driving section, and perform a normal driving operation which is a subsequent operation to the over-driving operation during a normal driving operation, and additionally perform the over-driving operation during a compensating section corresponding to the gapless pattern section in response to the detection result signal HFGL_OUT. The over-driving operation may include a series of operations of supplying an over-driving voltage VDD to a source voltage terminal RTO of a bit line sense amplification block 127, and the normal driving operation may include a series of operations of supplying a normal driving voltage VCORE to the source voltage terminal RTO of the bit line sense amplification block 127.

The internal circuit 120 may include a normal control block 121, an enabling block 123, a driving block 125, and the bit line sense amplification block 127. The normal control block 121 generates a first control signal SAP1_I, which is activated during the over-driving section, and a second control signal SAP2_I, which is activated during the normal driving section, in response to an active signal ACT. The enabling block 123 generates a first enable signal SAP1, which is activated during the over-driving section and the gapless pattern section, and a second enable signal SAP2, which is activated during the normal driving section, in response to the first and second control signals SAP1_I and SAP2_I and the detection result signal HFGL_OUT. The driving block 125 supplies the over-driving voltage VDD to the source voltage terminal RTO in response to the first enable signal SAP1 and supplies the normal driving voltage VCORE to the source voltage terminal RTO in response to the second enable signal SAP2. The bit line sense amplification block 127 is coupled with the source voltage terminal RTO.

The normal control block 121 generates the first and second control signals SAP1_I and SAP2_I, which are sequentially activated in response to the active signal ACT.

Figure 7:
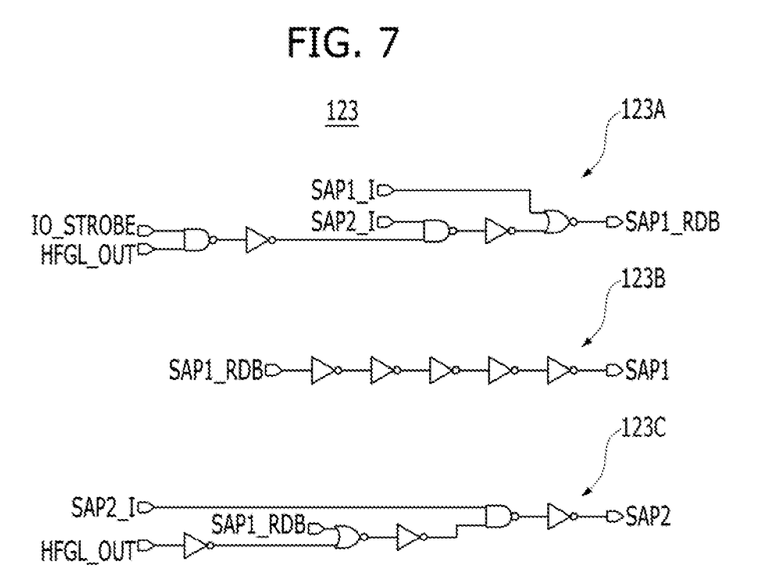
FIG. 7 is a detailed diagram of an enabling block shown in FIG. 2.

FIG. 7 is a detailed diagram of the enabling block 123 shown in FIG. 2.

Referring to FIG. 7, the enabling block 123 may include a first logic operation part 123A, a second logic operation part 123B and a third logic operation part 123C. The first logic operation part 123A generates an enable source signal SAP1_RDB by performing an OR operation on the read command IO_STROBE, the detection result signal HFGL_OUT and the first and second control signals SAP1_I and SAP2_I. The second logic operation part 123B generates the first enable signal SAP1 by inverting the enable source signal SAP1_RDB. The third logic operation part 123C generates the second enable signal SAP2 by performing an OR operation on the enable source signal SAP1_RDB, the detection result signal HFGL_OUT and the second control signal SAP2_I.

The first logic operation part 123A may include a first NAND gate, a first inverter, a second NAND gate, a second inverter, and a NOR gate. The first NAND gate performs a NOR operation on the read command IO_STROBE and the detection result signal HFGL_OUT. The first inverter inverts an output signal of the first NAND gate. The second NAND gate performs a NOR operation on an output signal of the first inverter and the second control signal SAP2_I. The second inverter inverts an output signal of the second NAND gate. The NOR gate outputs the enable source signal SAP1_RDB by performing a NOR operation on an output signal of the second inverter and the first control signal SAP1_I.

The second logic operation part 123B may include first to fifth inverters which are coupled with each other in series.

The third logic operation part 123C may include a first inverter, a NOR gate, a second inverter, a NAND gate, and a third inverter. The first inverter inverts the detection result signal HFGL_OUT. The NOR gate performs a NOR operation on an output signal of the first inverter and the enable source signal SAP1_RDB. The second inverter inverts an output signal of the NOR gate. The NAND gate performs a NOR operation on an output signal of the second inverter and the second control signal SAP2_I. The third inverter inverts an output signal of the NAND gate and outputs the second enable signal SAP2.

Figure 8:
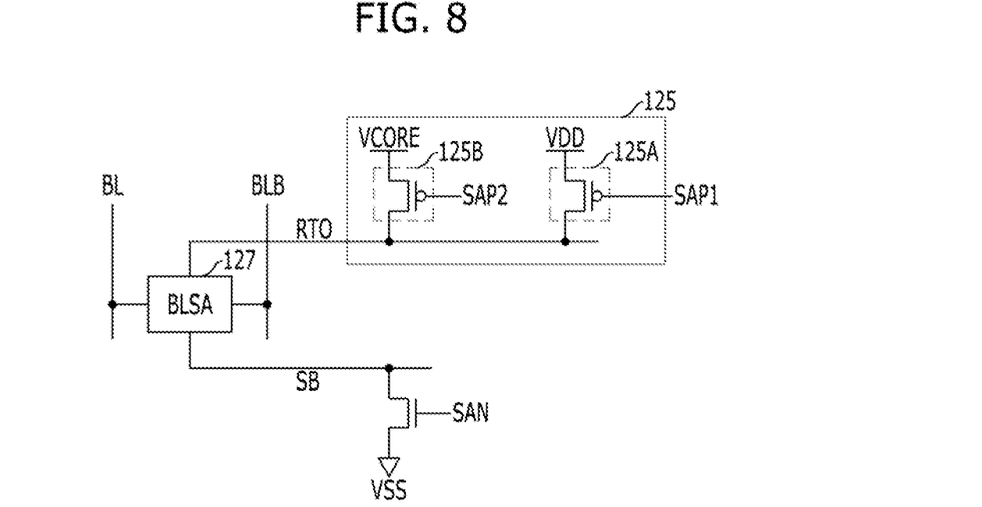
FIG. 8 is a detailed diagram of a driving block and a bit line sense amplification block shown in FIG. 2.

FIG. 8 is a detailed diagram of the driving block 125 and the bit line sense amplification block 127 shown in FIG. 2.

Referring to FIG. 8, the driving block 125 may include a first pull-up driving part 125A and a second pull-up driving part 125B. The first pull-up driving part 125A drives the source voltage terminal RTO with a power source voltage VDD in response to the first enable signal SAP1. The second pull-up driving part 125B drives the source voltage terminal RTO with a core voltage VCORE in response to the second enable signal SAP2. For example, the first and second pull-up driving parts 125A and 125B may include a PMOS transistor.

The bit line sense amplification block 127 amplifies data loaded onto a pair of bit lines BL and BLB by using a power source voltage VDD and a ground voltage VSS during the over-driving section, and amplifies the data loaded onto the pair of bit lines BL and BLB by using a core voltage VCORE and a ground voltage VSS during the normal driving section.

Hereafter, an operation of the semiconductor device 100 in accordance with the embodiment of the present invention is described with reference to FIGS. 9 to 12.

First, a case in which the semiconductor device 100 operates at high speed is described with reference to FIGS. 9 and 10.

Figure 9:
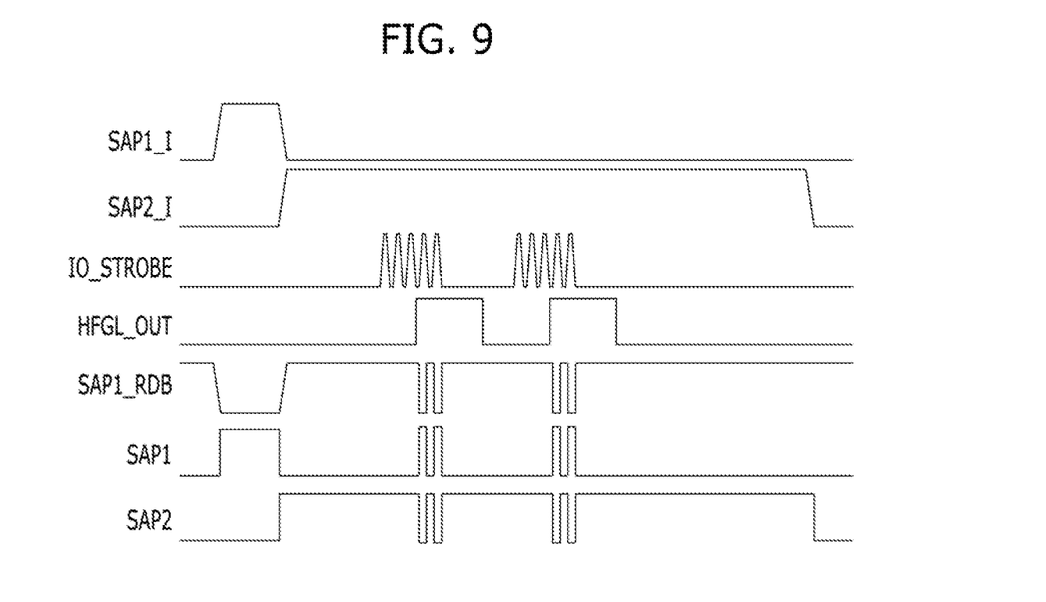
FIGS. 9 to 12 are timing diagrams illustrating an operation of the semiconductor device in accordance with an embodiment of the present invention.

FIG. 9 is a timing diagram illustrating an operation of the internal circuit 120 when the semiconductor device 100 operates at high speed.

Referring to FIG. 9, the internal circuit 120 may perform an over-driving operation and a normal driving operation in response to the active signal ACT. To be specific, the normal control block 121 generates the first and second control signals SAP1_I and SAP2_I, which are sequentially activated in response to the active signal ACT. The enabling block 123 generates the first enable signal SAP1, which is activated during the over-driving section, and the second enable signal SAP2, which is activated during the normal driving section, in response to the first and second control signals SAP1_I and SAP2_I. The driving block 125 drives the source voltage terminal RTO with the power source voltage VDD in response to the first enable signal SAP1, and drives the source voltage terminal RTO with the core voltage VCORE in response to the second enable signal SAP2. The bit line sense amplification block 127 amplifies data loaded onto a pair of bit lines BL and BLB by using the power source voltage VDD and the ground voltage VSS during the over-driving section, and amplifies the data loaded onto the pair of bit lines BL and BLB by using the core voltage VCORE and the ground voltage VSS during the normal driving section.

Meanwhile, the read command IO_STROBE may be inputted during the normal driving section. The enabling block 123 generates the first and second enable signals SAP1 and SAP2 where the read command IO_STROBE and the detection result signal HFGL_OUT are reflected. In other words, the enabling block 123 toggles the first and second enable signals SAP1 and SAP2 corresponding to the read command IO_STROBE during a compensating section where the detection result signal HFGL_OUT is activated. Subsequently, when the driving block 125 alternately supplies the core voltage VCORE and the power source voltage VDD to the source voltage terminal RTO during the compensating section, the voltage level of the source voltage terminal RTO increases momentarily, and the voltage level of the bit lines BL and BLB increases as well. Consequently, the voltage level of the bit lines BL and BLB may be prevented from dropping as the voltage level of the source voltage terminal RTO increases momentarily although the gapless pattern section where the read command IO_STROBE successively toggles occurs.

Figure 10:
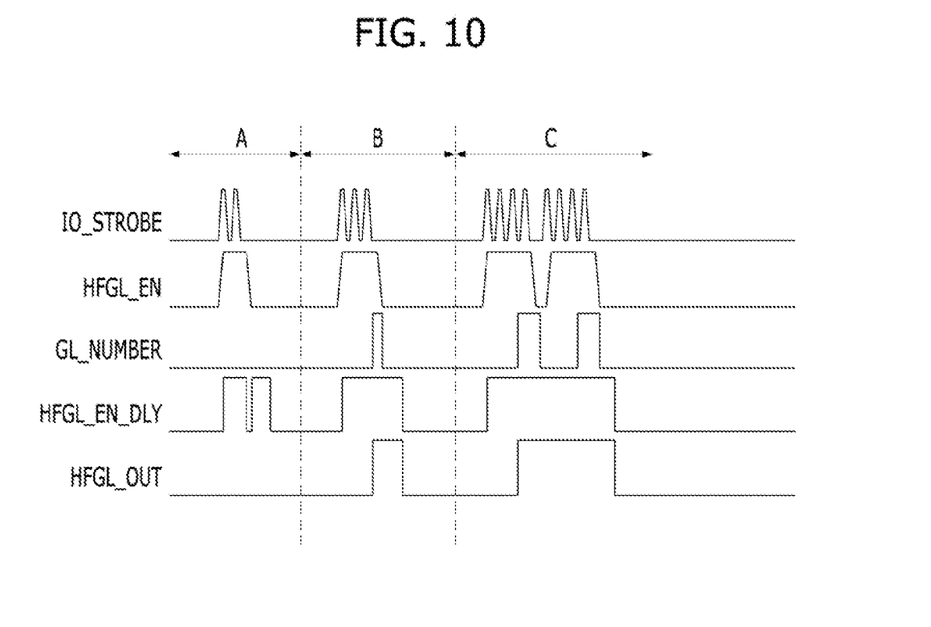

FIG. 10 is a timing diagram illustrating an operation of the detection circuit 110 when the semiconductor device 100 operates at high speed.

Referring to FIG. 10, the detection circuit 110 continuously deactivates the detection result signal HFGL_OUT when the read command IO_STROBE toggles two or less times (refer to 'A' in the drawing). When the read command IO_STROBE toggles three or more times, the detection circuit 110 activates the detection result signal HFGL_OUT during the compensating section corresponding to the gapless pattern section (refer to 'B' in the drawing). The condition for activating the detection result signal HFGL_OUT relates to the successive toggling times of the read command IO_STROBE, and the toggling times of the read command IO_STROBE may be set based on the number of the D flip-flops 111B_51, 111B_53 and 111B_55 included in the number detection signal generation part 111B (refer to FIG. 4B). When the gapless pattern section successively occurs with a gap corresponding to a first clock, the detection circuit 110 activates the detection result signal HFGL_OUT in disregard of the gap (refer to 'C' in the drawing).

Next, a case in which the semiconductor device 100 operates at low speed is described with reference to FIGS. 11 to 12.

Figure 11:
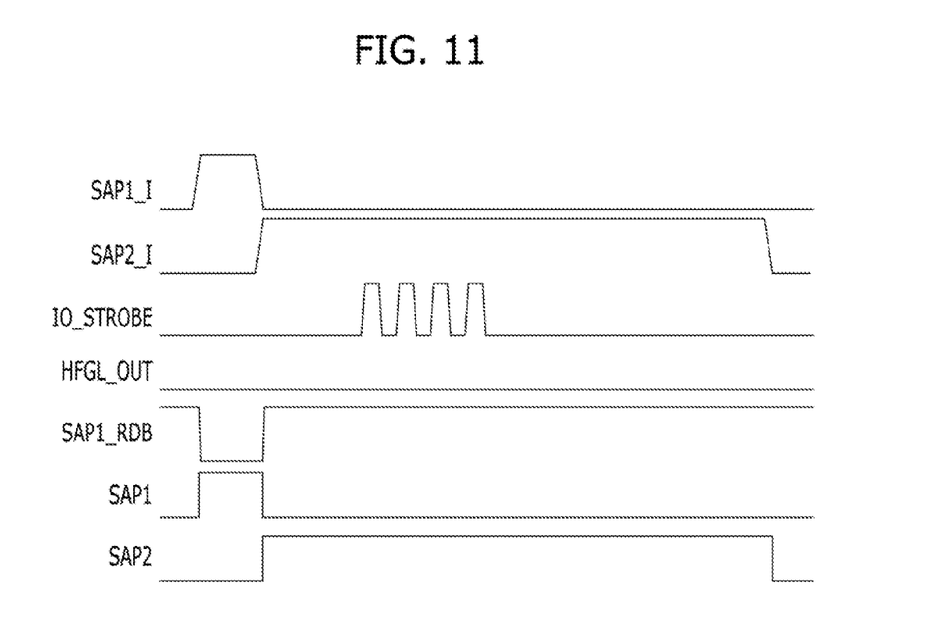

FIG. 11 is a timing diagram illustrating an operation of the internal circuit 120 when the semiconductor device 100 operates at low speed.

Referring to FIG. 11, since the operation of the internal circuit 120 is the same as the operation shown in FIG. 9, a detailed description thereon is omitted. The internal circuit 120 uniformly maintains the first and second enable signals SAP1 and SAP2 during the normal driving section based on the detection result signal HFGL_OUT, which is deactivated even though the gapless pattern section, where the read command IO_STROBE toggles three or more times, occurs.

Figure 12:
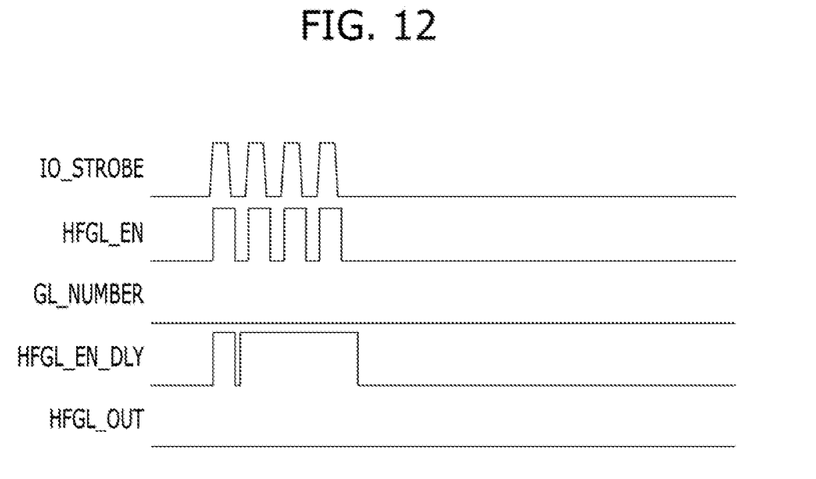

FIG. 12 is a timing diagram illustrating an operation of the detection circuit 110 when the semiconductor device 100 operates at low speed.

Referring to FIG. 12, the detection circuit 110 continuously deactivates the detection result signal HFGL_OUT regardless of the gapless pattern section when the read command IO_STROBE has a period corresponding to the low-speed operation. To be specific, the gapless pattern detection part 111A generates the section detection signal HFGL_EN which toggles corresponding to the read command IO_STROBE when the read command IO_STROBE toggles at a period corresponding to low-speed operation. The reason why the section detection signal HFGL_EN toggles relates to a delay time of the delay unit 111A_3 included in the gapless pattern detection part 111A. The number detection signal generation part 111E continuously deactivates the number detection signal GL_NUMBER based on the toggling of the section detection signal HFGL_EN toggles. This is because the counting unit 111B_5 included in the number detection signal generation part 111B is initialized whenever the section detection signal HFGL_EN. Therefore, the detection result signal HFGL_OUT is continuously deactivated since the number detection signal GL_NUMBER is deactivated, although the section change signal HFGL_EN_DLY is activated.

In accordance with the embodiments of the present invention, there is an advantage in correcting the voltage level of a bit line when a gapless pattern section occurs when a semiconductor device is operating at high speed.

In accordance with the embodiments of the present invention, a compensation operation for improving the performance of the semiconductor device may be performed by detecting a gapless pattern section of a signal, which directs the same operation, in the worst case scenario of continuously performing the same operation at high frequency.

While the present invention has been described with respect to the specific embodiments, it is noted that the embodiments of the present invention are not meant to be limiting but descriptive. Further, it is noted that the present invention may be achieved in various ways through substitution, change, and modification, by those skilled in the art without departing from the scope of the present invention as defined by the following claims.

What is claimed is:
1. A semiconductor device, comprising:
   a detection circuit suitable for detecting a gapless pattern section in which a detection target signal sequentially toggles without a time-gap; and
   an internal circuit suitable for performing a normal operation during a normal section and additionally performing the normal operation during a compensating section corresponding to the gapless pattern section in response to a detection result signal outputted from the detection circuit.

2. The semiconductor device of claim 1, wherein the detection circuit includes:
   a toggling number detection block suitable for generating a number detection signal corresponding to a toggling number of the detection target signal when the detection target signal successively toggles; and
   a detection result signal generation block suitable for generating the detection result signal, which is activated during the compensating section, in response to the number detection signal.

3. The semiconductor device of claim 2, wherein the toggling number detection block includes:
   a gapless pattern detection part suitable for generating a section detection signal, which is activated during the gapless pattern section in response to the detection target signal; and
   a number detection signal generation part suitable for activating the number detection signal when the detection target signal toggles a predetermined number of times or more in response to the detection target signal and the section detection signal.

4. The semiconductor device of claim 3, wherein the gapless pattern detection part detects whether the semiconductor device operates at a high speed based on a toggling period of the detection target signal, and activates the section detection signal during the gapless pattern section when the semiconductor device operates at the high speed as a detection result, and toggles the section detection signal during the gapless pattern section when the semiconductor device operates at a low speed as the detection result.

5. The semiconductor device of claim 4, wherein the number detection signal generation part unconditionally deactivates the number detection signal regardless of the toggling number of the detection target signal, when the semiconductor device operates at the low speed.

6. The semiconductor device of claim 3, wherein the detection result signal generation block includes:
   an enabling section change part suitable for generating a section change signal by changing an enabling section of the section detection signal; and
   a latch unit suitable for activating the detection result signal in response to the number detection signal and deactivating the detection result signal in response to the section change signal.

7. The semiconductor device of claim 1, wherein the detection target signal includes a read command or a write command.

8. The semiconductor device of claim 1, wherein the normal operation includes an over-driving operation where an over-driving voltage is supplied to a source voltage terminal of a bit line sense amplification block.

9. The semiconductor device of claim 8, wherein the internal circuit includes:
   a normal control block suitable for generating a control signal, which is activated during an over-driving section corresponding to the over-driving operation, in response to an active signal;
   an enabling block suitable for generating an enable signal, which is activated during the over-driving section and the gapless pattern section, in response to the control signal and the detection result signal; and
   a driving block suitable for supplying the over-driving voltage to the source voltage terminal in response to the enable signal.

10. A semiconductor device, comprising:
    a detection circuit suitable for detecting a gapless pattern section in which a detection target signal sequentially toggles without a time-gap; and
    an internal circuit suitable for performing a first normal operation during a first normal section and performing a second normal operation, which is a subsequent operation to the first normal operation, during a second normal section and additionally performing the first normal operation during a compensating section corresponding to the gapless pattern section in response to a detection result signal outputted from the detection circuit.

11. The semiconductor device of claim 10, wherein the detection circuit includes:
    a toggling number detection block suitable for generating a number detection signal corresponding to a toggling number of the detection target signal when the detection target signal successively toggles; and
    a detection result signal generation block suitable for generating the detection result signal, which is activated during the compensating section, in response to the number detection signal.

12. The semiconductor device of claim 11, wherein the toggling number detection block includes:
    a gapless pattern detection part suitable for generating a section detection signal, which is activated during the gapless pattern section, in response to the detection target signal; and
    a number detection signal generation part suitable for activating the number detection signal when the detection target signal toggles the predetermined number of times or more in response to the detection target signal and the section detection signal.

13. The semiconductor device of claim 12, wherein the gapless pattern detection part detects whether the semiconductor device operates at high speed based on a toggling period of the detection target signal, and activates the section detection signal during the gapless pattern section when the semiconductor device operates at high speed as a detection result, and toggles the section detection signal during the gapless pattern section when the semiconductor device operates at low speed as the detection result.

14. The semiconductor device of claim 13, wherein the number detection signal generation part unconditionally deactivates the number detection signal regardless of the toggling times of the detection target signal, when the semiconductor device operates low speed.

15. The semiconductor device of claim 12, wherein the detection result signal generation block includes:
    an enabling section change part suitable for generating a section change signal by changing an enabling section of the section detection signal; and
    a latch unit suitable for enabling the detection result signal in response to the number detection signal and deactivating the detection result signal in response to the section change signal.

16. The semiconductor device of claim 10, wherein the detection target signal includes a read command or a write command.

17. The semiconductor device of claim 10, wherein the first normal operation includes an over-driving operation where an over-driving voltage is supplied to a source voltage terminal of a bit line sense amplification block, and the second normal operation includes a normal driving operation where a normal driving voltage is supplied to the source voltage terminal of the bit line sense amplification block.

18. The semiconductor device of claim 17, wherein the internal circuit includes:
- a normal control block suitable for generating a first control signal, which is activated during an over-driving section corresponding to the over-driving operation, and a second control signal, which is activated during a normal driving section corresponding to the normal driving operation, in response to an active signal;
- an enabling block suitable for generating a first enable signal, which is activated during the over-driving section and the gapless pattern section and a second enable signal, which is activated during the normal driving section, in response to the first and second control signals and the detection result signal; and
- a driving block suitable for supplying the over-driving voltage to the source voltage terminal in response to the first enable signal and the normal driving voltage to the source voltage terminal in response to the second enable signal.

19. The semiconductor device of claim 18, wherein the enabling block includes:
- a first logic operation part suitable for generating an enable source signal by performing a logic operation on the detection target signal, the detection result signal and the first and second control signals;
- a second logic operation part suitable for generating the first enable signal by inverting the enable source signal; and
- a third logic operation part suitable for generating the second enable signal by performing a logic operation on the enable source signal, the detection result signal and the second control signal.

20. A gapless pattern detection circuit comprising:
- a toggling number detection block suitable for receiving a detection target signal, and generating a section detection signal activated during a gapless pattern section and a number detection signal corresponding to a toggling number of the detection target signal when the detection target signal successively toggles; and
- a detection result signal generation block suitable for generating a detection result signal, which is activated during a compensating section corresponding to the gapless pattern section, in response to the number detection signal and the section detection signal.

* * * * *